United States Patent [19]

Baucom

[11] Patent Number: 5,576,636
[45] Date of Patent: Nov. 19, 1996

[54] LOW POWER PROGRAMMABLE LOGIC ARRAYS

[75] Inventor: Terry L. Baucom, Folsom, Calif.

[73] Assignee: Intel Corporation, Santa Clara, Calif.

[21] Appl. No.: 515,248

[22] Filed: Aug. 15, 1995

[51] Int. Cl.⁶ .................. H03K 19/177; H03K 19/094
[52] U.S. Cl. .................. 326/39; 326/44; 326/93
[58] Field of Search .................. 326/21, 39, 41, 326/44–45, 49–50, 93, 98, 82–83; 327/544

[56] References Cited

U.S. PATENT DOCUMENTS

| 4,740,721 | 4/1988 | Chung et al. | 326/45 |
| 4,990,801 | 2/1991 | Caesar et al. | 326/45 |
| 5,010,258 | 4/1991 | Usami et al. | 326/45 |
| 5,101,122 | 3/1992 | Shinonara | 326/44 |
| 5,124,584 | 6/1992 | McClure | 326/82 |
| 5,475,320 | 12/1995 | Ko | 326/21 |

Primary Examiner—Edward P. Westin
Assistant Examiner—Jon Santamauro
Attorney, Agent, or Firm—Blakely, Sokoloff, Taylor & Zafman

[57] ABSTRACT

A programmable logic array including a plurality of AND gates for providing product terms, a plurality of OR gates connected to receive the product terms for providing output signals, and circuitry for reducing power dissipation caused by the application of clock signals to the programmable logic array.

8 Claims, 4 Drawing Sheets

LOW POWER PROGRAMMABLE LOGIC ARRAYS

BACKGROUND OF THE INVENTION

1. Field of the Invention

This invention relates to logic circuits and, more particularly, to methods and apparatus for reducing the power utilized in programmable logic array circuits.

2. History of the Prior Art

Programmable logic arrays (PLAS) are arrays of gates which allow a plurality of input values to be manipulated in accordance with various Boolean functions. In a basic form, such an array comprises a first series of input conductors each of which may carry a binary input value and a second series of input conductors each of which may carry the inverse of the binary input value carried by an associated one of the first series of input conductors. These first and second input conductors are selectively joined to a third series of conductors each of which is connected to a plurality of AND gates. In the basic form of programmable logic array, the output of each AND gate (called a product term) is available at the input to each of a plurality of OR gates. Since any one of the input conductors may be selectively joined to each of the third series of conductors, all of the input conductors are available to each of the AND gates in this form of gate array. By connecting various AND gate outputs (product terms) to various OR gates, a particular Boolean function which is the sum of the products terms produced by the AND gates may be furnished at the output of any OR gate. Thus, the Boolean output function provided at the output of each of the OR gates is programmable by selecting the connections to be made between the input conductors and the conductors of the third series.

Because programmable logic grays are designed with a plurality of AND gates providing input to a plurality of OR gates from which output signals indicating the result of a logic function are derived, it will be understood that a very large number of input signals is reduced to a much smaller number of output signals. As the number of input conductors increases and the circuit traces are placed closer to one another, the inherent capacitance experienced by the individual circuits increases. Since the gating circuitry responds to a system clock, a plurality of circuit nodes exhibiting high capacitance are constantly changing voltage levels. This is typically true of all of the AND gates which produce the product terms in programmable logic arrays even though the data to be evaluated changes infrequently. The constant change of voltage levels requires a great deal of power because such a large amount of circuitry is utilized to generate the product terms.

Furthermore, in circuits including programmable logic arrays which provide clocked output signals, unless the circuitry is very accurately timed, output signals will tend to be generated before they have stabilized. If output circuitry responds to these signals before these signals have stabilized, power is required to drive the output to a first level and then more power is required to reverse the level. This also uses more power than is necessary.

It is desirable to reduce the amount of power required in programmable logic arrays while maintaining the ability of those circuits to provide the same functions at the same speed.

SUMMARY OF THE INVENTION

It is, therefore, an object of the present invention to provide apparatus and a method for reducing a potation of the power usage in programmable logic arrays.

This and other objects of the present invention are realized by a programmable logic array including a plurality of AND gates for providing product terms, a plurality of OR gates connected to receive the product terms for providing output signals, and means for reducing power dissipation caused by the application of clock signals to the programmable logic array.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
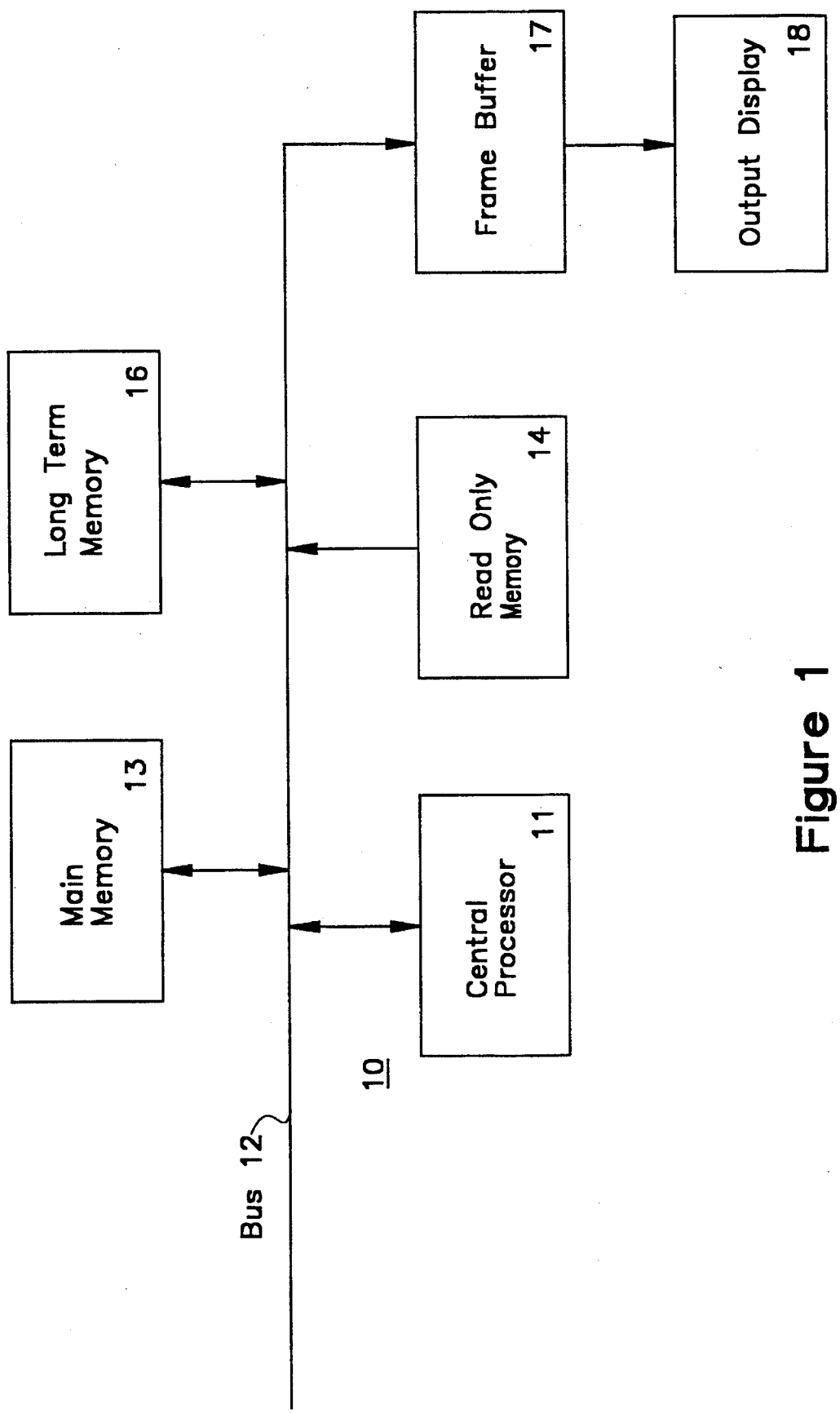
FIG. 1 is a block diagram of a digital system designed in accordance with the present invention.

Referring now to FIG. 1, there is illustrated a computer system 10. The system 10 includes a central processing unit 11 which executes the various instructions provided to control the operations of the computer system 10. The central processing unit 11 is coupled to a bus 12 adapted to carry information to various components of the system 10. Coupled to the bus 12 is main memory 13 which is typically constructed of dynamic random access memory arranged in a manner well known to those skilled in the prior art to store information during a period in which power is provided to the system 10. Also connected to the bus 12 are various peripheral components such as long term memory 16 and circuitry such as a frame buffer 17 to which data may be written which is to be transferred to an output device such as a monitor 18 for display.

Figure 2:
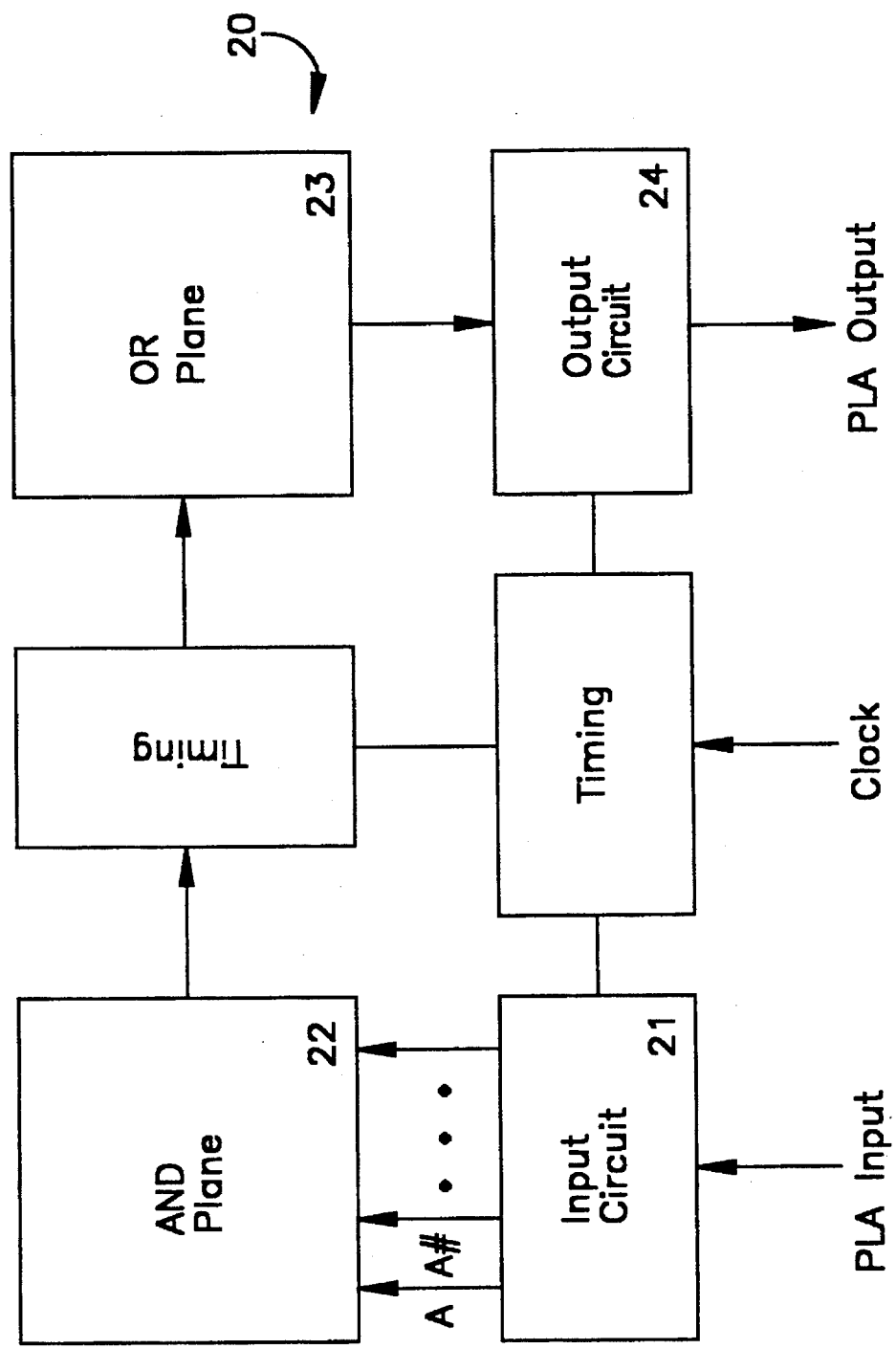
FIG. 2 is a block diagram illustrating a programable logic array.
Figure 3:
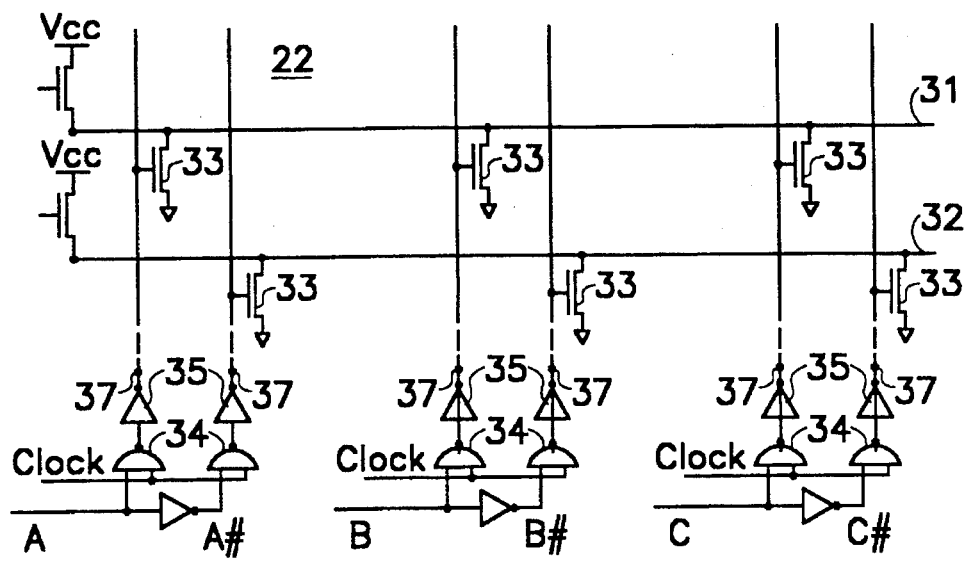
FIG. 3 is a circuit diagram of one portion of a prior art programmable logic array.

Programmable logic arrays may be utilized by various components of a computer system such as that illustrated in FIG. 1 to carry out various logic functions. Programmable logic arrays typically require less circuitry to execute logic functions than do normal gate circuits and may be easily modified by masking. For example, various embodiments of the i486™ microprocessor manufactured by Intel Corporation of Santa Clara, Calif., include programmable logic arrays. Such arrays are used to implement logic functions, among other things, for breaking instructions into elements at the input to the microcode, for determining the particular interrupt at the interrupt circuitry, and for enforcing the rules of segmentation of the processor FIG. 2 is a block diagram illustrating the typical association of components in a programmable logic array 20. As may be seen, the array 20 includes an input circuit 21 which receives a large number of input signals and transfers selected ones of those input signals to the AND plane 22 in response to a system clock. The AND plane 22 includes a plurality of individual AND gates which provide the product term output signals. The product term signals are clocked from the AND plane 22 to an OR plane 23. The results provided by the individual gates of the OR term 23 are clocked by an output circuit 24 to the output of the programmable logic array 20. FIG. 3 is a partial circuit diagram illustrating the arrangement of devices in the AND plane 22 of a programmable logic array 20 constructed in accordance with the teachings of the prior art. In FIG. 3, a pair of product terms are provided on conductors 31 and 32 in response to input signals provided by the input circuit 21. Three individual input circuit arrangements are illustrated for generating signals referred to as A, A#, B, B#, C, and C#. As may be seen, the conductor 31 is coupled to receive the result provided by the ANDing of each of the input signals A, B, and C and a clock while the conductor 32 is coupled to receive the input signals A#, B#, and C#. The input signals for each input circuit are furnished through a pair of NAND gates 34 which produce a low output if both input signals are high and a high output for all other conditions. The output of each NAND gate 34 is furnished by an inverter 35 to the gate terminal of one of a series of N type devices (typically field effect transistor devices) 33. If any of the input signals A, B, and C is high while the clock is high, then some of the series of N type devices 33 are enabled; and ground is provided on the conductor 31. If, on the other hand, all of the input signals A, B, and C are low during a high clock, then all of the N type devices 33 are disabled; and a voltage level Vcc provided through precharging is furnished on the conductor 31 indicating the selection of that product term. The conductor 32 which responds to the input signals A#, B#, and C# functions in a similar manner.

In a typical programmable logic array, clock signals appear at a frequency much higher than do input signal transitions. During the period in which no input signal changes occur, the voltage level on the input lines remains at the same state as the last input signal furnished. It will be seen that during the majority of the time during which no input signal changes occur, one of the two NAND gates 34 in each input circuit will receive a high valued input on the input line and will therefore respond to the value of the clock alone to produce an output which toggles the node 37 at the output of the inverter 35 between high and low values and drives the gate terminal of the associated device 33. This continuous driving of the nodes 37 in response to the clock requires a substantial amount of current and therefore consumes a significant amount of power. This is especially true because of the very large number of input signals which must be provided to the AND plane providing a large interconnect capacitance and the large number of devices 33 which exhibit gate capacitance.

Figure 4:
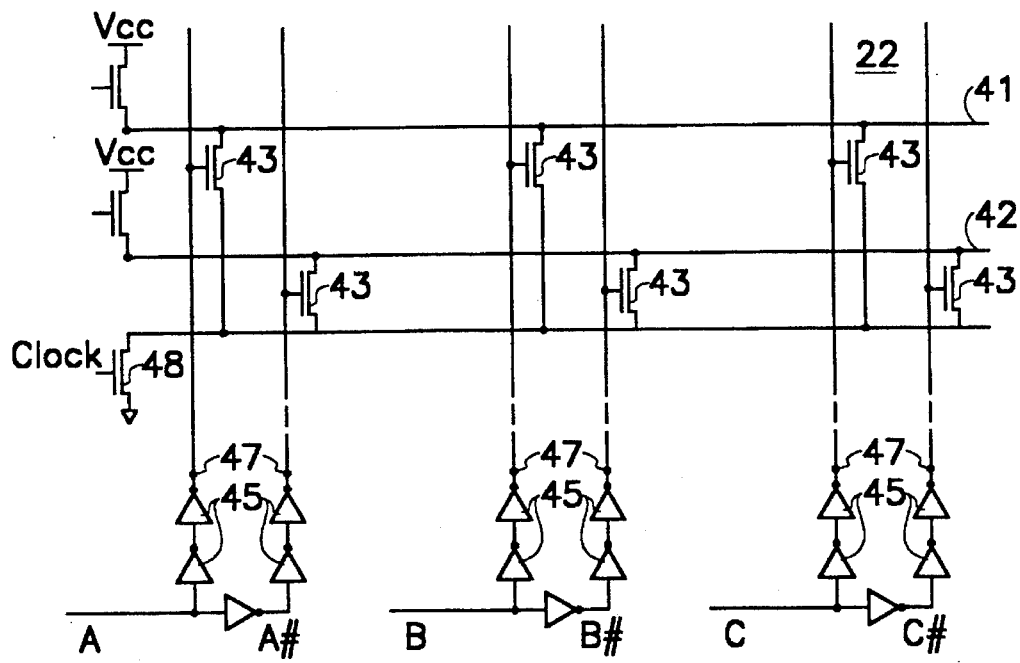
FIG. 4 is a circuit diagram of a portion of a programmable logic array designed in accordance with the present invention.

One way in which the present invention reduces the amount of power consumed by programmable logic arrays is illustrated in FIG. 4. The circuit of FIG. 4 replaces each input circuit of FIG. 3 in the AND plane 22 of a programmable logic array and eliminates the toggling of the nodes in the input to the AND gates. As may be seen in FIG. 4, the NAND gates 34 of FIG. 3 have been eliminated. Instead, sets of inverters 45 provide the input signals to the gate terminals of the devices 43. The clock is now furnished at the gate terminal of an N type device 48 so that a high value enables the device 48 to connect the source terminals of the devices 48 to ground. It will be recognized that although the devices 43 will continue to conduct current at the clock rate and the product terms will continue to be evaluated, the nodes 47 change voltage level only with a change in the input signals. Because the nodes 47 which connect to the gate terminals of the devices 43 no longer toggle with the clock value, the power required in the prior art circuit of FIG. 3 to drive the highly capacitive loads at those nodes is not required by the circuit of FIG. 4. This substantially reduces the power requirements of the programmable logic array.

Figure 5:
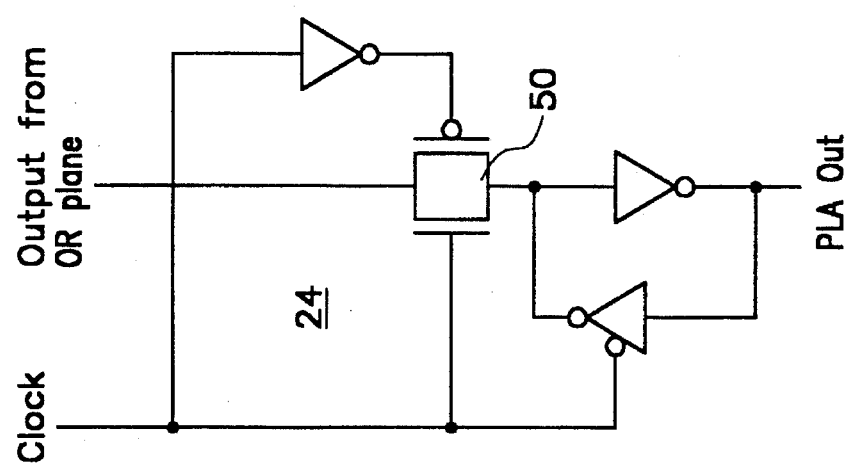
FIG. 5 is a circuit diagram of another portion of a prior art programmable logic array.

FIG. 5 is a circuit diagram of a prior art arrangement for the output circuit 24 of a programable logic array. The circuit 24 includes a transmission gate 50 which receives the output of one of the OR terms from the OR plane. The output of the OR term is clocked through the transmission gate 50 and latched at the output to provide the programmable logic array output signal. Coupled to the output is a substantial amount of combinational logic which responds to any present state presented at the output.

Unfortunately, this output circuit 24 tends to respond to a state on the OR term before that state has stabilized. Consequently, the output of the circuit tends to move first in one direction and then in the other before the final output is produced. Because of the combinatorial logic joined to that output, the change of state in first one direction and then in the other dissipates more power than necessary.

Figure 6:
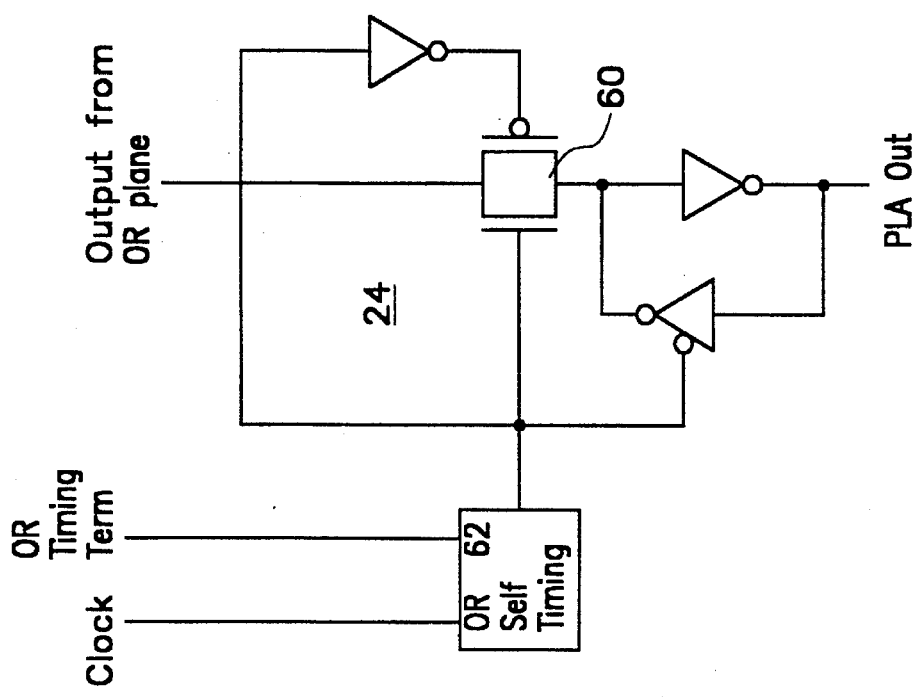
FIG. 6 is a circuit diagram of another portion of a programmable logic array designed in accordance with the present invention.

The circuit of FIG. 6 is designed in accordance with the present invention to reduce the power requirements of the circuit 24. As may be seen, a transmission gate 60 which receives the output of the OR term is gated by the output produced by a self-timing circuit 62. The self timing circuit 62 provides an output to enable the transmission gate only when the output of the OR term has stabilized. To accomplish this, the self-timing circuit 62 receives an input from an OR timing term. The OR timing term is specifically designed to provide an output which includes the same delays as occur in the circuitry of the other OR terms so that an output is produced only when the output of the OR terms has stabilized. This OR timing term is furnished to the self-timing circuit 62 along with the clock. The OR timing term gates the clock to enable the transmission gate 60 only when the input furnished by the OR term to the transmission gate 60 has stabilized. This eliminates the tendency of the output to swing in two directions and waste power.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programmable logic array for realizing a Boolean function from a plurality of inputs comprising:

a plurality of AND gates that provide product terms from the plurality of inputs;

a plurality of OR gates that provide the Boolean function as output signals from the product terms;

a first field-effect transistor associated with each of the plurality of inputs, each input being coupled to the gate of the first field-effect transistor, with the source and drain of the first field-effect transistor being coupled to provide a source potential to a product term; and a second field-effect transistor, the source, drain, and gate of the second field-effect transistor being coupled to the drains of each of the first field-effect transistors, a ground potential, and a clock signal, respectively;

a plurality of output circuits coupled to receive output signals from one of the plurality of OR gates, each of the output circuits including a switching circuit and a self-timing circuit, the switching circuit being enabled by a signal produced by the self-timing circuit to transfer an output signal to an output terminal, the signal being produced by gating the clock signal with an OR timing term.

2. A programmable logic array as claimed in claim 1 in which the switching circuit comprises a transmission gate.

3. A programmable logic array including:

a plurality of AND gates for providing product terms, each AND gate comprising:

AND gate input circuitry including a first field-effect transistor for each input signal, the source and drain of the first field-effect transistor being coupled to provide a logically low voltage to the output of a product term;

a conductive path for providing an input signal to the gate of the first field-effect transistor; and a second field effect transistor responsive to clock signals for coupling the drain of the first field-effect transistor to the logically low voltage;

a plurality of OR gates connected to receive the product terms for providing output signals; and a plurality of output circuits each connected to receive an output signal from one of the plurality of OR gates, each of the output circuits comprising:

a switching circuit responsive to an enabling signal that transfers the output signal of one of the plurality of OR gates to an output terminal, and a self-timing circuit that produces the enabling signal responsive to a clock signal and an output signal of a second OR gate.

4. A programmable logic array as claimed in claim 3 in which the switching circuit comprises a transmission gate.

5. A microprocessor comprising:

a programmable logic array including:

a plurality of AND gates for providing product terms, each AND gate comprising:

AND gate input circuitry including a first field-effect transistor for each input signal, the source and drain of the first field-effect transistor being coupled to provide a logically low voltage to the output of a product term;

a conductive path for providing an input signal to the gate of the first field-effect transistor; and a second field effect transistor responsive to clock signals for coupling the drain of the first field-effect transistor to the logically low voltage;

a plurality of OR gates connected to receive the product terms for providing output signals; and a plurality of output circuits each connected to receive an output signal from one of the plurality of OR gates, each of the output circuits comprising:

a switching circuit responsive to an enabling signal that transfers the output signal of one of the plurality of OR gates to an output terminal, and a self-timing circuit that produces the enabling signal responsive to a clock signal and an output signal of a second OR gate.

6. A microprocessor as claimed in claim 5 in which the switching circuit comprises a transmission gate.

7. A computer system including:

a system bus;

a main memory;

a plurality of input/output devices; and a central processing unit comprising:

a programmable logic array including:

a plurality of AND gates for providing product terms, each AND gate comprising:

AND gate input circuitry including a first field-effect transistor for each input signal, the source and drain of the first field-effect transistor being coupled to provide a logically low voltage to the output of a product term;

a conductive path for providing an input signal to the gate of the first field-effect transistor; and a second field effect transistor responsive to clock signals for coupling the drain of the first field-effect transistor to the logically low voltage;

a plurality of OR gates connected to receive the product terms for providing output signals; and a plurality of output circuits each connected to receive an output signal from one of the plurality of OR gates, each of the output circuits comprising:

a switching circuit responsive to an enabling signal that transfers the output signal of one of the plurality of OR gates to an output terminal, and a self-timing circuit that produces the enabling signal responsive to a clock signal and an output signal of a second OR gate.

8. A computer system as claimed in claim 7 in which the switching circuit comprises a transmission gate.

* * * * *

UNITED STATES PATENT AND TRADEMARK OFFICE
CERTIFICATE OF CORRECTION

| | | |
|---|---|---|
| PATENT NO. | : | 5,576,636 |
| DATED | : | November 19, 1996 |
| INVENTOR(S) | : | Terry L. Baucom |

It is certified that error appears in the above-identified patent and that said Letters Patent is hereby corrected as shown below:

In column 1 at line 11 delete "(PLAS)" and insert --(PLAs)

In column 1 at line 34 delete "grays" and insert --arrays--

In column 1 at line 66 delete "potation" and insert --portion--

In column 2 at line 18 delete "programable" and insert --programmable--

In column 4 at line 38 delete "programable" and insert --programmable--

Signed and Sealed this

Eleventh Day of March, 1997

*Attest:*

BRUCE LEHMAN

*Attesting Officer*   Commissioner of Patents and Trademarks